(12) United States Patent
Okamoto

(10) Patent No.: US 8,665,430 B2
(45) Date of Patent: Mar. 4, 2014

(54) EXPOSURE CONDITION DETERMINING METHOD AND SURFACE INSPECTION APPARATUS

(75) Inventor: Hiroaki Okamoto, Yokohama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 13/340,742

(22) Filed: Dec. 30, 2011

(65) Prior Publication Data

US 2012/0099120 A1 Apr. 26, 2012

Related U.S. Application Data

(63) Continuation of application No. PCT/JP2010/004317, filed on Jun. 30, 2010.

(30) Foreign Application Priority Data

Jul. 1, 2009 (JP) .................................. 2009-156654

(51) Int. Cl.
*G01N 21/00* (2006.01)
*G01B 9/00* (2006.01)

(52) U.S. Cl.
USPC .................. 356/237.2; 356/237.4; 356/237.5; 356/124

(58) Field of Classification Search
None
See application file for complete search history.

(56) References Cited

U.S. PATENT DOCUMENTS

| | | | | |
|---|---|---|---|---|
| 4,350,884 A | * | 9/1982 | Vollath | 250/204 |
| 5,830,611 A | * | 11/1998 | Bishop et al. | 430/30 |
| 6,245,584 B1 | * | 6/2001 | Marinaro et al. | 438/14 |
| 6,452,671 B1 | * | 9/2002 | Uda et al. | 356/237.2 |
| 6,646,735 B2 | * | 11/2003 | Fukazawa et al. | 356/237.4 |
| 7,057,715 B2 | * | 6/2006 | Robinson | 356/124 |
| 7,333,650 B2 | * | 2/2008 | Yamamoto et al. | 382/145 |
| 8,005,292 B2 | * | 8/2011 | Sakai et al. | 382/149 |
| 2002/0017620 A1 | * | 2/2002 | Oomori et al. | 250/559.4 |
| 2002/0018139 A1 | * | 2/2002 | Yamagata | 348/333.09 |
| 2002/0093647 A1 | * | 7/2002 | Fukazawa et al. | 356/237.1 |
| 2003/0112428 A1 | * | 6/2003 | Oomori et al. | 356/237.3 |
| 2004/0218804 A1 | * | 11/2004 | Affleck et al. | 382/141 |
| 2004/0239918 A1 | * | 12/2004 | Sugihara et al. | 356/237.2 |
| 2005/0280806 A1 | * | 12/2005 | Oomori et al. | 356/237.2 |

(Continued)

FOREIGN PATENT DOCUMENTS

| | | |
|---|---|---|
| JP | 10-326735 | 12/1998 |
| JP | 2003-142397 | 5/2003 |

(Continued)

OTHER PUBLICATIONS

International Search Report in International Application No. PCT/JP2010/004317; Mailing Date: Aug. 17, 2010.

(Continued)

*Primary Examiner* — Gordon J Stock, Jr.
(74) *Attorney, Agent, or Firm* — Finnegan, Henderson, Farabow, Garrett & Dunner, LLP

(57) ABSTRACT

There is provided an exposure condition determining method for determining an exposure condition for an exposure-objective substrate having a plurality of semiconductor pattern features formed by predetermined exposure on a surface thereon, the method including, irradiating an illumination light onto a surface of a substrate, which has the pattern features, detecting a diffracted light from the plurality of semiconductor pattern features of the substrate irradiated with the illumination light, and determining the exposure condition based on a variation in brightness of the detected diffracted light.

8 Claims, 7 Drawing Sheets

(56) References Cited

U.S. PATENT DOCUMENTS

| | | | |
|---|---|---|---|
| 2006/0192953 A1* | 8/2006 | Fukazawa et al. | 356/237.5 |
| 2006/0232769 A1* | 10/2006 | Sugihara et al. | 356/237.2 |
| 2007/0182955 A1* | 8/2007 | Tomita et al. | 356/237.1 |
| 2008/0208499 A1 | 8/2008 | Miyashita | |
| 2008/0292977 A1 | 11/2008 | Kawachi et al. | |
| 2009/0059231 A1* | 3/2009 | Fukazawa et al. | 356/369 |
| 2011/0235038 A1* | 9/2011 | Fukazawa et al. | 356/369 |
| 2011/0242520 A1* | 10/2011 | Kosugi et al. | 355/77 |
| 2013/0217154 A1* | 8/2013 | Fukazawa et al. | 438/7 |

FOREIGN PATENT DOCUMENTS

| | | |
|---|---|---|
| JP | 2006-41549 | 2/2006 |
| JP | 2008-112889 | 5/2008 |
| JP | 2008-294094 | 12/2008 |
| KR | 10-2008-0059572 | 6/2008 |
| KR | 10-0856357 | 9/2008 |

OTHER PUBLICATIONS

Notice of Preliminary Rejection issued for corresponding Korean Patent Application No. 2012-7001534 dated Jun. 23, 2013, with partial English language translation.

English language translation of Notice of Rejection issued for corresponding Japanese Patent Application No. 2011-520790 dated Aug. 20, 2013.

* cited by examiner

CALCULATE AVERAGE BRIGHTNESS OF EACH CHIP
AFTER MASKING A CERTAIN AREA FROM
CIRCUMFERENCE FOR EACH CHIP

AREA DEFINITION IN CHIP (EXAMPLE)

IMAGE OF REGARDING MEMORY CELL BLOCKS
AS REPETITIVE PATTERNS

IMAGE OF DIFFRACTED LIGHT BRIGHTNESS

|  | -0.15 | -0.12 | -0.09 | -0.06 | -0.03 | 0.00 | 0.03 | 0.06 | 0.09 | 0.12 | 0.15 |
|---|---|---|---|---|---|---|---|---|---|---|---|
|  | C1 | C2 | C3 | C4 | C5 | C6 | C7 | C8 | C9 | C10 | C11 |
| R1 |  |  | 26 | 13 | 16 | 16 | 16 | 17 | 28 |  |  |
| R2 |  | 44 | 35 | 16 | 18 | 14 | 12 | 23 | 28 | 12 |  |
| R3 | 33 | 51 | 36 | 16 | 11 | 12 | 14 | 17 | 23 | 10 | 40 |
| R4 | 38 | 38 | 30 | 13 | 12 | 12 | 14 | 23 | 27 | 12 | 50 |
| R5 | 39 | 51 | 36 | 14 | 14 | 14 | 11 | 21 | 24 | 6 | 51 |
| R6 | 45 | 51 | 36 | 11 | 10 | 10 | 8 | 16 | 17 | 19 | 51 |
| R7 |  | 41 | 28 | 11 | 13 | 15 | 19 | 27 | 14 | 31 |  |
| R8 |  |  | 30 | 11 | 11 | 12 | 15 | 18 | 24 |  |  |

IN-SHOT VARIATION IN AVERAGE BRIGHTNESS
IN CHIP (EXAMPLE)

MAXIMUM VALUE OF VARIATION IN SHOT
(OVER THE RANGE OF WAFER CENTER FROM R3 TO R6)

FOCUS OFFSET [μm]

GRAPH OF BRIGHTNESS VARIATION IN SHOT

NONDEFECTIVE OR DEFECTIVE
DETERMINATION RESULT WITH SEM
(EXAMPLE)

EXAMPLE OF FEM WAFER (FOCUS EXPOSURE MATRIX)

ONE SHOT

☐ : ONE CHIP

● : OBSERVATION POINT WITH SEM

OBSERVATION POINTS WITH SEM IN ONE SHOT (EXAMPLE)

Fig. 12A
Fig. 12B
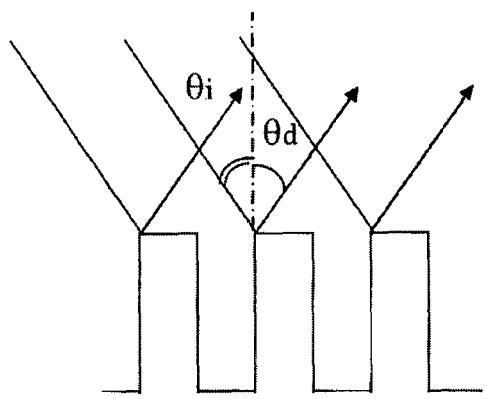
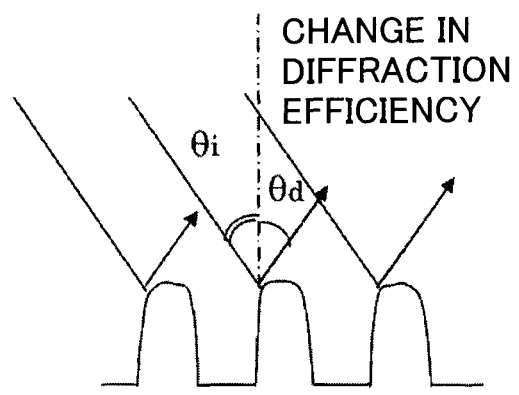
CHANGE IN DIFFRACTION EFFICIENCY

EXPOSURE CONDITION DETERMINING METHOD AND SURFACE INSPECTION APPARATUS

CROSS-REFERENCE TO RELATED APPLICATION

This application is a Continuation Application of International Application No. PCT/JP2010/004317 which has filed on Jun. 30, 2010 claiming the conventional priority of Japanese patent Application No. 2009-156654 filed on Jul. 1, 2009.

BACKGROUND

1. Field of the Invention

The present invention relates to a technique for determining an exposure condition such as focus offset and the like for exposure systems utilized in semiconductor fabrication.

2. Description of the Related Art

Best focus position and effective focus range in exposure are important for exposure systems such as scanners, steppers and the like utilized generally in fabricating semiconductors such as memories, logics, and the like (for example, see Japanese Patent Application Laid-Open No. 2006-41549). The abovementioned effective focus range (to be referred to as the focus margin hereinbelow) is defined to be the range of focus offset such that the line width (the hole diameter in the case of a via hole) of a circuit pattern feature generated as a result of exposure lies within a designed allowable value satisfying the operational specifications as a circuit.

Inspection with a scanning electron microscope (to be referred to as an SEM hereinbelow) is regarded as a typical method for inspecting whether or not the pattern feature is generated within the designed allowable value. However, since it is difficult for an SEM to reach a high throughput in principle, as shown in FIG. 11 for example, the inspection is carried out in practice by sampling five points or so in an exposed shot. On the other hand, scatterometry (Optical CD: to be referred to as OCD hereinbelow) is regarded as a system of measuring wide-area information with a high throughput. However, in order to carry out such measurement, it is necessary to provide a dedicated pattern feature for a certain size of area (approximately 50 μm×50 μm), a library for simulation results, and the like. Therefore, it is difficult in principle to inspect a specific pattern feature within an actual circuit pattern feature.

Further, in LSI fabrication, it is important whether fine and dense pattern features for which that the exposure device may greatly deliver its exposure performance are resolved evenly and just as designed. For example, at the time of exposing vertical line-and-space pattern features, the exposure system per se is optimized with modified or transformed illumination such that those critical pattern features may be exposed with a high degree of accuracy. As a result, the focus margin also becomes comparatively wide with the critical pattern features for which the exposure system is optimized. On the other hand, when focusing attention on pattern features different from the above critical pattern features in the duty ratio of line and space such as so-called isolated pattern features, compared with the focus margin of the critical pattern features for which the exposure system is optimized, the focus margin of the isolated pattern features and the like tends to be narrow. Since these are actual circuit pattern features, the above OCD is not applicable. Further, since a great number of points are to be observed in the pattern feature plane, utilizing an SEM requires an immense amount of time. Further, when the pattern feature shape is not a simple straight line, there are cases that the pattern feature shape cannot be evaluated if a plurality of points are not measured within the visual field, thereby further reducing the throughput of the SEM.

As a means for evaluating best focus, there is a method utilizing an FEM (Focus Exposure Matrix) wafer 100 (see FIG. 10) with shots 101 exposed in sequence on the wafer while changing the focus offset of the exposure device in minute steps. As a control method, the focus margin and the focus offset value for the best focus are calculated by utilizing a measuring device such as the SEM, OCD and the like to monitor the line width (the hole diameter in the case of a via hole) of the pattern feature formed in the photoresist of the FEM wafer 100. However, in the case of the aforementioned pattern features different from the critical pattern features in the duty ratio of line and space, because the control with the OCD is impossible due to the actual circuit pattern features, and utilizing the SEM requires large amounts of time and cost, it is difficult in reality to carry out a routine check. Further, supposing the SEM carried out the control, such method would be considered requiring much time before the measuring result can be fed back.

In contrast, there is a method for monitoring the best focus by detecting a change in polarization due to form birefringence in the pattern feature formed on the wafer surface. According to such method, by finding the peak of brightness (luminance) average for each shot, it is possible to speedily find the best focus. Because it is also possible to measure the best focus in a short time for the critical pattern features in the FEM wafer 100, the measuring result can be rapidly fed back to the process.

However, with respect to isolated pattern features (such as guard pattern features and the like) formed repetitively at intervals of a memory-mat size, because the pitch is greater than that of the critical pattern features, it is difficult in principle to capture the change in polarization. Therefore, diffracted light is utilized because if a pattern feature change occurs such as the pattern feature shown in FIG. 12B where collapse is arising, then a change in diffraction efficiency occurs in the diffracted light from the line-and-space pattern feature or guard pattern feature with respect to the normal pattern feature shown in FIG. 12A. As a result, it is possible to capture the pattern feature change as a brightness change of the diffracted light.

SUMMARY

An aspect of the present teaching provides an exposure condition determining method for determining an exposure condition for an exposure-objective substrate having a plurality of semiconductor pattern features formed by predetermined exposure on a surface thereon, the method including: irradiating an illumination light onto a surface of a substrate, which has the pattern features; detecting a diffracted light from the plurality of semiconductor pattern features of the substrate irradiated with the illumination light; and determining the exposure condition based on a variation in brightness of the detected diffracted light.

BRIEF DESCRIPTION OF THE DRAWINGS

FIGS. 12A and 12B are schematic diagrams showing a change in diffraction efficiency.

DESCRIPTION OF EMBODIMENTS

Figure 2:
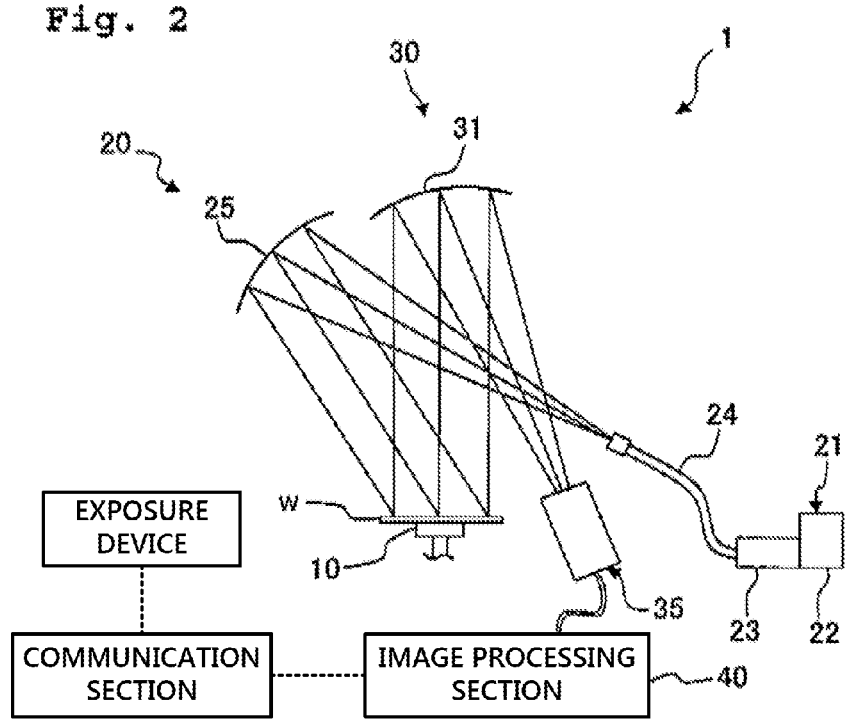
FIG. 2 shows a surface inspection apparatus.

Hereinbelow, referring to the accompanying drawings, an embodiment of the present teaching will be explained. FIG. 2 shows a surface inspection apparatus utilized in the embodiment to inspect the surface of a semiconductor wafer W as a semiconductor substrate (to be referred to as a wafer W hereinbelow). The surface inspection apparatus 1 includes a stage 10 for supporting the approximately disk-shaped wafer W, which is transported therein by an unshown transport device and placed on the stage 10 while being fixed and held by vacuum suction. The stage 10 supports the wafer W to be rotatable (within the surface of the wafer W) with a rotational symmetrical axis of the wafer W (the central axis of the stage 10) as the rotation axis. Further, the stage 10 can tilt the wafer W about an axis through the surface of the wafer W, and can adjust the incidence angle of illumination light (illumination light beam).

Further, the surface inspection apparatus 1 is configured to include an illumination system 20 for irradiating the surface of the wafer W supported on the stage 10 with an illumination light as a parallel light (parallel light beam), a light receiving system 30 for condensing diffracted light (diffracted light beam) from the wafer W receiving the irradiation of the illumination light, an imaging device 35 for taking an image of the surface of the wafer W receiving the light beam condensed by the light receiving system 30, and an image processing section 40. The illumination system 20 is configured to have an illumination unit 21 for emitting the illumination light, and an illumination-side concave mirror 25 for reflecting the illumination light emitted from the illumination unit 21 toward the surface of the wafer W. The illumination unit 21 is configured to have a light source 22 such as a metal halide lamp, a mercury lamp and the like, a dimmer 23 for adjusting light intensity by extracting the light beam having a predetermined wavelength from the light from the light source 22, and a light guiding fiber 24 for guiding the light beam from the dimmer 23 as the illumination light to the illumination-side concave mirror 25.

Then, the light beam from the light source 22 is transmitted through the dimmer 23, and the illumination light having a predetermined wavelength (248 nm, for example) is emitted from the light guiding fiber 24 to the illumination-side concave mirror 25. Then, because the exit portion of the light guiding fiber 24 is arranged on the focal plane of the illumination-side concave mirror 25, the illumination light emitted from the light guiding fiber 24 to the illumination-side concave mirror 25 becomes a parallel light flux due to the illumination-side concave mirror 25 to irradiate the surface of the wafer W held on the stage 10. Further, it is possible to adjust the relation between the incoming angle and the outgoing angle to the wafer W for the illumination light by tilting the stage 10 to change the angle of placing the wafer W.

The light receiving system 30 condenses the exit light beam (diffracted light beam) from the surface of the wafer W. The light receiving system 30 is composed mainly of a light-receiving-side concave mirror 31 provided to face the stage 10, and the exit light beam condensed by the light-receiving-side concave mirror 31 (diffracted light) comes to form an image of the wafer W (a diffraction image) on the imaging plane by an imaging optical system inside the imaging device 35. The imaging device 35 photoelectrical converts the image of the surface of the wafer W formed on the imaging plane to generate an image signal, and outputs the image signal to the image processing section 40.

The image processing section 40 generates a digital image of the wafer W based on the image signal of the wafer W inputted from the imaging device 35. An inner memory (not shown) of the image processing section 40 prestores image data of nondefective wafers. After generating an image of the wafer W (digital image), the image processing section 40 compares the image data of the wafer W with the image data of nondefective wafers to inspect whether or not there is any defect (abnormity) in the surface of the wafer W. Then, the inspection result from the image processing section 40 and the image of the relevant wafer W are outputted on an image display device (not shown). Further, the image processing section 40 is capable of finding (carrying out computation of finding) the focus margin in exposure and the like by utilizing the image of the wafer (details will be described hereinafter). Further, the image processing section 40 is connected to an external output portion, and thus is capable of electrically communicating the computation result of the focus margin and the like with the exposure device (exposure equipment) and the like via this external output portion. Note that as long as the image processing section 40 is connected to the exposure device in a communicatable manner, the image processing section 40 can be connected to the exposure device with an arbitrary method. For example, the image processing section 40 can be connected to the exposure device via an optical interconnection or a wireless network.

The exposure device exposes the uppermost resist film of the wafer W, which is developed by a development device (not shown) and then transported onto the stage 10 by the unshown transport device from an unshown wafer cassette or the development device. Further at this time, the wafer W is transported onto the stage 10 in a state of being aligned with the pattern feature or the outer edge (notch, orientation flat or the like) of the wafer W as the reference. Further, on the surface of the wafer W, though detailed illustration being omitted, a plurality of shots are arranged horizontally and vertically, and in each of the shots, a repetitive pattern feature (a semiconductor pattern feature) such as a line pattern feature, a hole pattern feature, or the like is formed.

In order to utilize the surface inspection apparatus 1 configured in the above manner to carry out surface inspection of the wafer W, first, the wafer W is transported onto the stage 10 by the unshown transport device. Further, it is possible to place the wafer W on the stage 10 in predetermined position and direction by an unshown alignment mechanism acquiring positional information of the pattern feature formed in the surface of the wafer W in transporting.

Next, the stage 10 is rotated such that the direction of illuminating the surface of the wafer W may be consistent with the repetitive direction of the pattern feature and, meanwhile, be set to satisfy the following equation (1) (to tilt the stage 10), where P represents the pattern feature pitch, λ represents the wavelength of the illumination light irradiating the surface of the wafer W, θi represents the incidence angle of the illumination light, and θd represents the exit angle of the nth-order diffracted light (also see FIGS. 12A and 12B).

$$P = n \times \lambda / \{\sin(\theta i) - \sin(\theta d)\} \quad \text{(Eq. 1)}$$

Next, the surface of the wafer W is irradiated with the illumination light. When irradiating the surface of the wafer W with the illumination light under such a condition, the light beam from the light source 22 in the illumination unit 21 is transmitted through the dimmer 23. The illumination light having a predetermined wavelength (248 nm, for example) exits from the light guiding fiber 24 to the illumination-side concave mirror 25, and the illumination light reflected by the illumination-side concave mirror 25 becomes a parallel light flux to irradiate the surface of the wafer W. The diffracted light diffracted from the surface of the wafer W is condensed by the light-receiving-side concave mirror 31, and reaches the imaging plane of the imaging device 35 to form an image (diffraction image) of the wafer W.

Here, the imaging device 35 photoelectrical converts the surface image of the wafer W formed on the imaging plane to generate an image signal, and outputs the image signal to the image processing section 40. The image processing section 40 generates a digital image of the wafer W based on the image signal of the wafer W inputted from the imaging device 35. Further, after generating the image (digital image) of the wafer W, the image processing section 40 compares the image data of the wafer W with the image data of nondefective wafers to inspect whether or not there is any defect (abnormity) in the surface of the wafer W. Then, the inspection result from the image processing section 40 and the image of the relevant wafer W are outputted on the image display device (not shown).

In the embodiment, the focus margin in exposure is found by utilizing the abovementioned surface inspection apparatus 1 to detect the brightness (brightness change) of the diffracted light and calculate the brightness variation (unevenness, dispersion) in the shot. Generally, on the wafer W exposed by the exposure device (not shown) such as a scanner and the like, although the evenness of the pattern feature exposed in the shot (image plane) is controlled with an extremely high degree of accuracy, due to a variety of factors, it does not necessarily mean a completely even pattern feature is formed.

However, if the exposure is carried out by setting a focus offset sufficiently within the focus margin, then even though there are some factors contributory to minute in-plane variation of the image plane, the influence on the line width and the like of the pattern feature to be formed is vary small. Thus, when the formed pattern feature is regarded as a diffraction grating, the diffracted light is still measured as with an almost even brightness. On the other hand, if the exposure is carried out by setting a focus offset approaching the boundary of the focus margin, then even the above minute in-plane variation can still give rise to a change in the shape of the formed pattern feature. As a result, variation occurs in the brightness of the diffracted light in the shot.

Figures 6, 7:
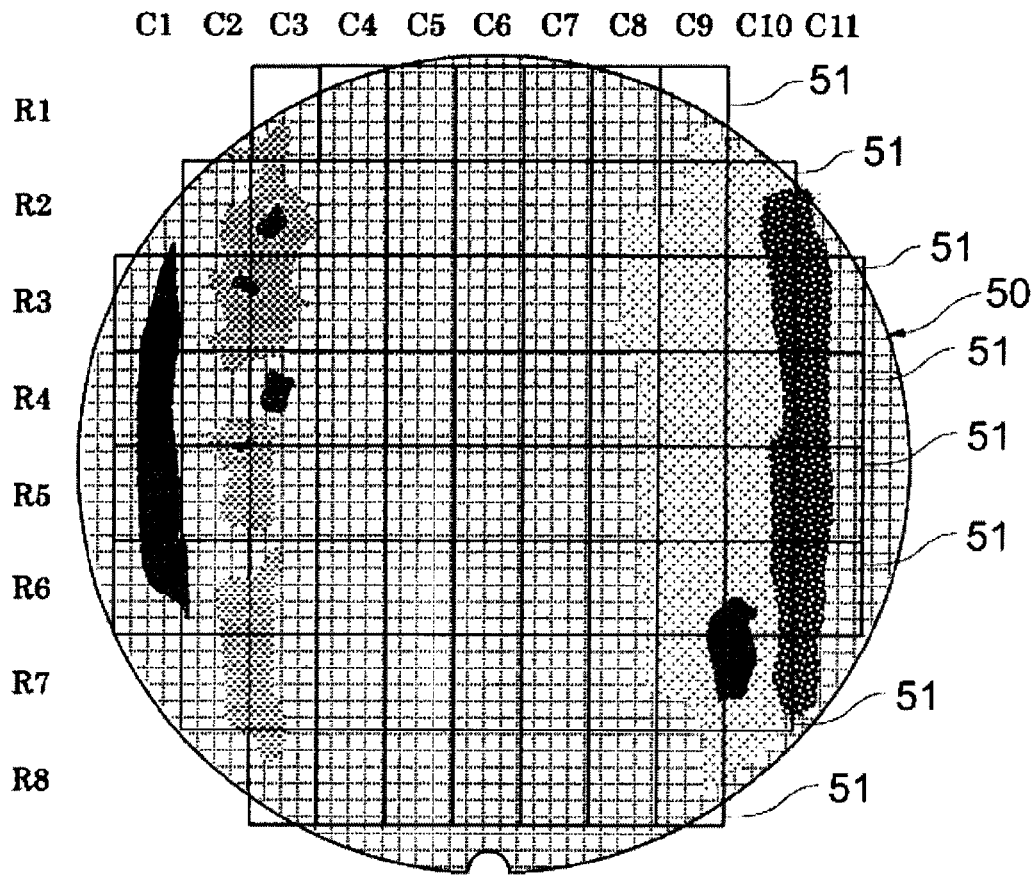
FIG. 6 shows an image of brightness of diffracted light from an FEM wafer.
FIG. 7 is a distribution diagram showing variation of the brightness of diffracted light.

In the embodiment, on an FEM wafer 50 such as shown in FIG. 6, a steadily exposable focus margin is found by evaluating the variation in the diffracted light brightness in shots 51 in the vicinity of the boundary of the focus margin (setting the condition for the brightness variation to become the maximum or approach the maximum). Further, on the surface of the FEM wafer 50 shown in FIG. 6, the crisscross-arranged shots 51 are formed through exposure while changing the focus offset in steps of LF in the horizontal direction (in FIG.

6), and chip regions in these shots 51 (to be referred to simply as chips 52 hereinbelow) are formed to define in a three-by-three matrix (see FIG. 3).

Figure 3:
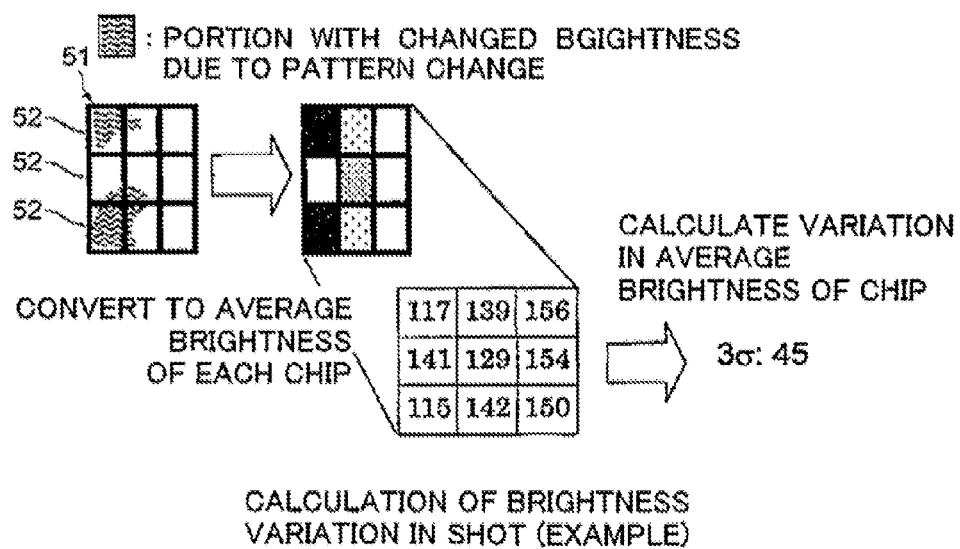
FIG. 3 is a schematic diagram showing an example of calculating variation in brightness.
Figure 4:
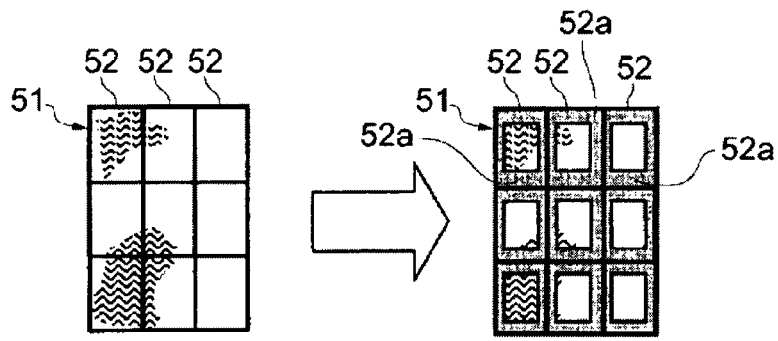
FIG. 4 is a schematic diagram showing an example of defining a detection area in a chip.

With respect to the evaluation of the brightness variation, as shown in FIG. 3, it is conceivable to utilize the brightness average in units of the chips 52 which are the minimum repetitive pattern features, as the unit of calculating the variation, since the brightness average has an averaging effect. For example, the average brightness is calculated for each chip 52 in a certain shot 51 to calculate the variation in the average brightness found for each chip 52 in a certain shot 51 (for example, 3σ utilizing a standard deviation σ). At this time, in order to raise the detection sensitivity to the brightness variation, as shown in FIG. 4, it is also effective to provide a mask 52a in the area within a chip 52 (on the inner side of the circumferential portion) without diffracted light arising, and eliminate the signal from this area (the mask 52a). By virtue of this, because the average brightness for each chip 52 is calculated in the state of eliminating the brightness information on the portion of the mask 52a, it is possible to reduce the influence of the brightness in the area on the inner side of the circumferential portion of the chip 52 where the brightness variation is comparatively small, thereby improving the detection sensitivity to the brightness variation.

As described hereinabove, because the so-called isolated pattern feature has a narrower focus margin than the critical pattern feature for which the exposure system is optimized, it is possible to apply the present embodiment to detecting the pattern feature change in a isolated pattern feature with a large duty ratio of line and space, and which is not the critical pattern feature normally under the control of an SEM and the like.

Figure 11:
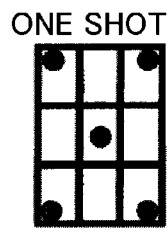
FIG. 11 shows an example of observation points with the SEM.

Next, explanations will be made with respect to a method for setting an exposure condition utilizing the surface inspection apparatus 1 of such type (the method for setting a focus margin). Further, it is conceivable to carry out in advance a nondefective or defective determination with an SEM image for the FEM wafer 50 exposed while changing the focus offset in steps of AF in the horizontal direction (for example, at five points in one shot as shown in FIG. 11). As the nondefective or defective determination in this case, it is mainly carried out by determining whether or not the CD value (the line width of a line pattern feature or the hole diameter of a hole pattern feature) lies within the nondefective range. However, it may as well be carried out by determining any collapse in the pattern feature shape with human eyes.

Figure 1:
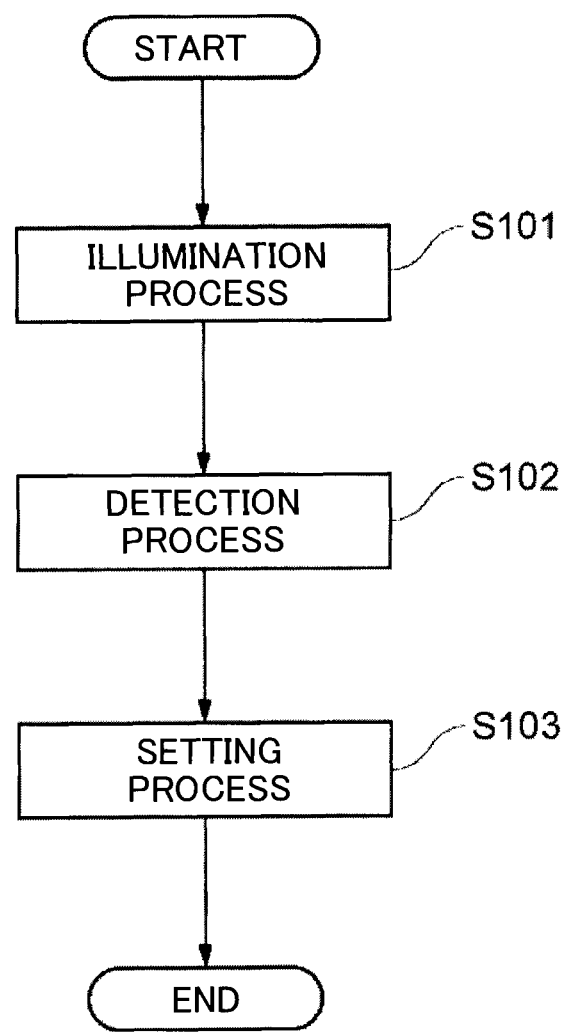
FIG. 1 is a flowchart showing an outline of an exposure condition setting method.
Figure 5:
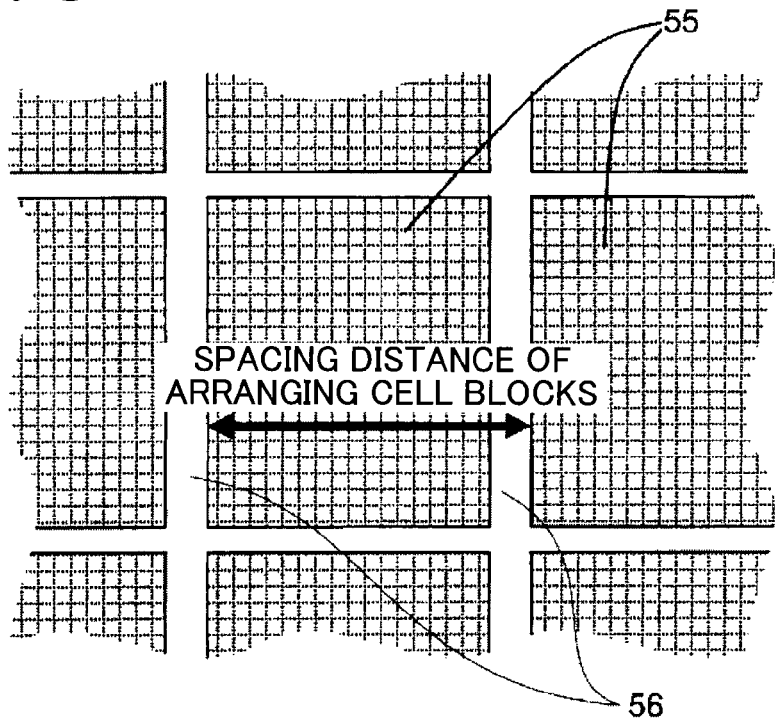
FIG. 5 shows blocks of memory cells.

Hereinbelow, referring to the flowchart shown in FIG. 1, explanations will be made with the example of guard pattern features 56 enclosing blocks 55 of rectangular memory cells as shown in FIG. 5 as an example of the aforementioned isolated pattern feature. Further, in the blocks 55 of memory cells, the critical pattern feature for which the exposure system is optimized (a line pattern feature or a hole pattern feature) is formed through exposure. The blocks 55 of memory cells are regularly arranged in a chip 52 at certain intervals (crisscross), and the guard pattern features 56 are formed in a grid-like arrangement in every interspace between two adjacent blocks 55 of memory cells. Therefore, as shown in FIG. 5, by regarding this arrangement interval as a significantly large pattern feature pitch (from tens μm to hundreds pm or more), it is possible to detect diffracted light of the corresponding wavelength.

Henceforth, first, the unshown transport device transports the FEM wafer 50 onto the stage 10 of the surface inspection apparatus 1, and the illumination system 20 is utilized to irradiate the surface of the FEM wafer 50 with an illumination light (step S101). In this illumination process, the stage 10 is rotated such that the direction of illuminating the surface of the FEM wafer 50 may consist with the repetitive direction of the blocks 55 of memory cells (the guard pattern features 56), while be set such that high-order diffracted light may be obtained rendering the repetitive pitch of the blocks 55 of memory cells (the guard pattern features 56) as the diffraction condition (tilting the stage 10 such that the aforementioned equation (1) may be satisfied).

When the illumination light irradiates the surface of the FEM wafer 50 under such condition, the light beam from the light source 22 in the illumination unit 21 is transmitted through the dimmer 23. The illumination light having a predetermined wavelength (248 nm, for example) exits from the light guiding fiber 24 toward the illumination-side concave mirror 25, and the illumination light reflected by the illumination-side concave mirror 25 becomes a parallel light flux to irradiate the surface of the FEM wafer 50. The diffracted light coming from the surface of the FEM wafer 50 is condensed by the light-receiving-side concave mirror 31, and reaches the imaging plane of the imaging device 35 to form an image of the FEM wafer 50 (a diffraction image of the guard pattern feature 56).

Then, the imaging device 35 is utilized to detect or take the image of the FEM wafer 50 (the diffraction image of the guard pattern feature 56; step S102). In this detection process, the imaging device 35 photoelectrical converts the image of the surface of the FEM wafer 50 formed on the imaging plane (the diffraction image of the guard pattern feature 56) to generate an image signal, and outputs the image signal to the image processing section 40.

Figure 8:
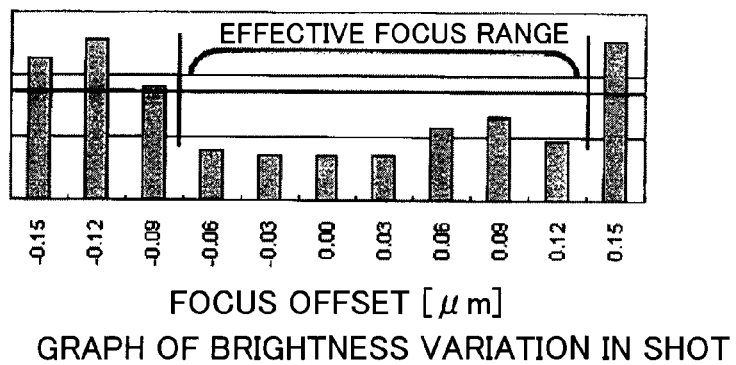
FIG. 8 is a graph showing the variation of the brightness of diffracted light.

Then, based on the image signal of the FEM wafer 50 inputted from the imaging device 35 (the brightness information corresponding to FIG. 6), the image processing section 40 detects an effective focus margin in exposure for the actual wafer W (step S102), and sets the best focus from the detected focus margin (step S103). In this setting process, first, the average brightness is calculated for each chip 52 in each shot 51 as in FIG. 3 to compute the variation in the average brightness on each chip 52 for each shot 51 as shown in FIG. 7. At this time, the data stability is obtainable by selecting the central vicinity of the FEM wafer 50 as the evaluation object. Further, even when changing the exposure amount (dose) along with the focus in steps, it is still desirable to utilize the data in the central vicinity of the FEM wafer 50, close to the best dosage. Taking the shots 51 with the row numbers R3 to R6 in FIG. 7 as the evaluation objects, FIG. 8 shows a graph of obtained values (the shots 51) for the brightness variation to become maximal for each focus offset value (each item of the column indexes C1 to C11).

Figure 9:
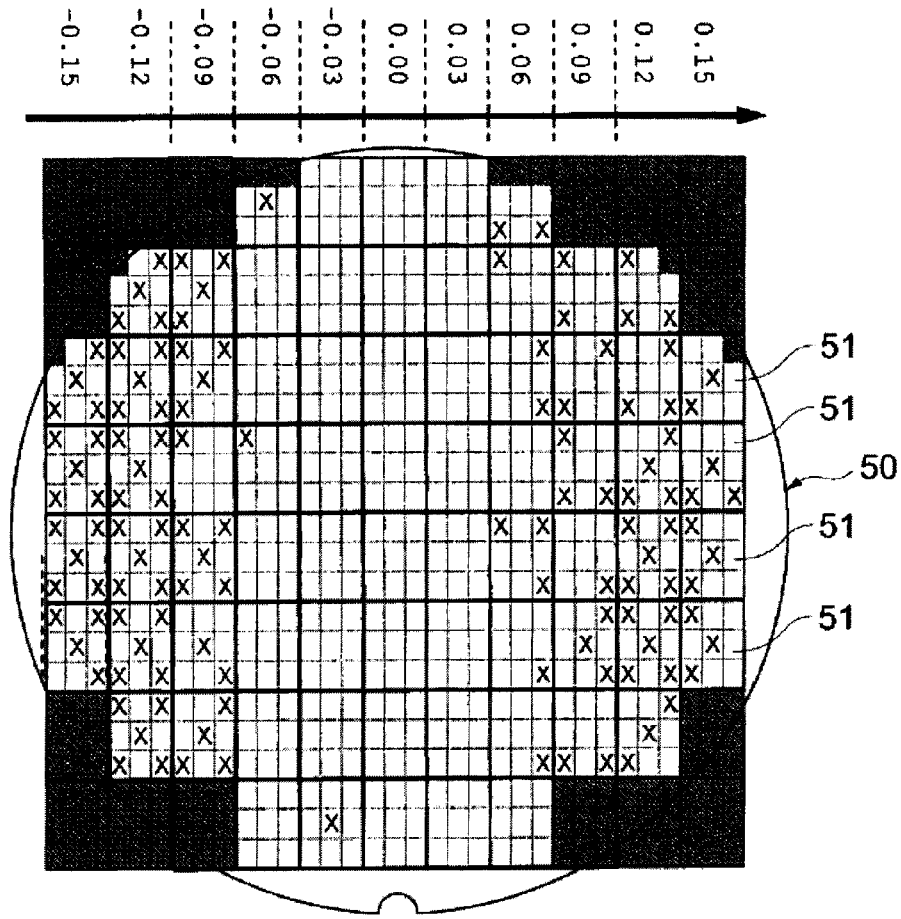
FIG. 9 shows a result of nondefective or defective determination by an SEM.
Figure 10:
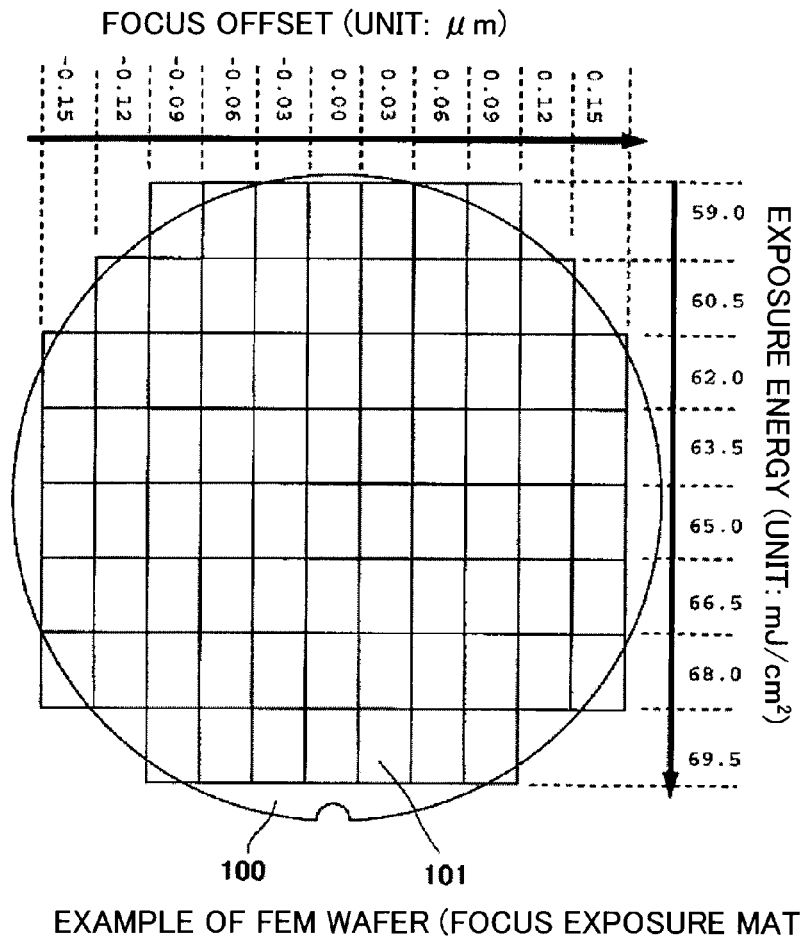
FIG. 10 shows an example of the FEM wafer.

Then, the variation value of brightness corresponding to defect is set by taking the correlation between the change in the variation of the average brightness in the obtained shots 51 (for each chip 52) and the nondefective or defective determination result carried out in advance with the SEM image (see FIG. 9). By virtue of this, because of continuously changing the focus offset of the exposure device with the FEM wafer in minute steps, it is possible to calculate, as the focus margin, the range of the focus offset for a variation value smaller than the variation value of brightness corresponding to defect. In the case of FIG. 8 for example, when the focus offset values are −0.09 (μm) and +0.15 (μm), the variation value of brightness becomes greater than that of the aforementioned variation value of brightness corresponding to defect (the heavy horizontal line in FIG. 8) to be a value approaching the maximum value. Hence, the focus margin is calculated as a value in the range of from −0.06 (μm) to +0.12 (μm), at which a brightness variation is smaller (smaller than the variation value of the variation value of brightness corresponding to defect) and the range included inside the range of from −0.09 (μm) to +0.15 (μm). At this time, it is possible to improve the degree of accuracy of setting the variation value of the variation value of brightness corresponding to defect by utilizing a plurality of FEM wafers (samples) to take the correlation between the change in the variation of the average brightness and the nondefective or defective determination result with the SEM image.

Further, when the object pitch is vary large (tens μm), it is effective to carry out the detection under the diffraction condition (pitch/order) that high-order diffracted light is obtainable. However, as an option of diffraction conditions, it is conceivable to select such a condition that the correlation is available between the variation in the average brightness (for each chip 52) in the obtained shot 51 and the nondefective or defective determination result with the SEM image, and the change in image brightness is large for the direction of the focus variation. Further, when there are two or more types of the object pattern features for confirming the focus margin (with different pitches or different pattern feature directions), the diffraction condition is set in correspondence with each type (pitch/diffracted light azimuth) to calculate the range of overlapping the effective focus areas under the plurality of respectively set diffraction conditions as the focus margin.

In this manner, according to the embodiment, for the semiconductor pattern feature exposed under the exposure condition (transformed illumination and the like) optimized for the semiconductor circuit pattern feature such as minute lines and spaces, and the like, it is possible to correctly set the focus offset (the proper exposure condition) to be the best focus by making use of the narrower focus margin of the pattern feature having a larger repetitive pitch compared with the line-and-space pattern feature such as the guard pattern feature 56 to detect the diffracted light from the guard pattern feature 56. Further, although diffracted light does not arise from semiconductor circuit pattern features of less than 40 nm, it is still possible to make use of diffracted light with the guard pattern feature 56 as the object.

Further, it is possible to correctly find the boundary portion (beyond the limit of the proper exposure condition) of the focus margin by setting, the condition value (focus offset value) at which the brightness variation becomes the maximum or approaches the maximum as the limit value.

Further, in the above embodiment, the focus margin is set as the exposure condition. However, being not limited to this, it is also effective to set the medium value of the focus margin as the representative value of the focus offset utilized for exposure. In the case of FIG. 8 for example, as described hereinbefore, the focus margin is from −0.06 (μm) to +0.12 (μm), and thereby the medium value 0.03 (μm) of this focus margin is set as the representative value of the focus offset.

What is claimed is:

1. An exposure condition determining method for determining an exposure condition for an exposure-objective substrate having a plurality of semiconductor pattern features formed by predetermined exposure on a surface thereon, the method comprising:
    irradiating an illumination light onto a surface of a substrate, which .has the pattern features;
    detecting a diffracted light from the plurality of semiconductor pattern features of the substrate irradiated with the illumination light; and
    determining the exposure condition based on a variation over a portion of the substrate in brightness of the detected diffracted light, wherein determining the exposure condition comprises determining a variation value of brightness of the diffracted light over a portion of the substrate that corresponds to one or more defects in the semiconductor pattern features, and determining a focus margin, wherein the focus margin is a range of focus offsets corresponding to variation values of brightness that are smaller than the variation value of brightness corresponding to the one or more defects.

2. The exposure condition determining method according to claim 1, wherein the exposure condition is determined based on an information from the plurality of pattern features on the substrate formed by an exposure having a known exposure characteristic and the variation in brightness of the detected diffracted light.

3. The exposure condition determining method according to claim 1, wherein detecting a diffracted light includes capturing an image of the substrate.

4. The exposure condition determining method according to claim 1, wherein a repetitively arranged guard pattern feature and a repetitively arranged linear line or hole pattern features are formed as the semiconductor pattern features, and the repetitively arranged guard pattern feature is arranged to surround a memory mat formed of the repetitively arranged line or hole pattern feature; and the plurality of semiconductor pattern features of the substrate are formed by exposure under a plurality of exposure conditions for the substrate, respectively.

5. The exposure condition determining method according to claim 1, further comprising:

preparing a surface inspection. apparatus including an illumination section which is configured to irradiate the illumination light onto the substrate, and a detection section which is configured to detect the diffracted light from the plurality of semiconductor pattern features of the substrate irradiated with the illumination light, the surface inspection apparatus being configured to inspect the surface of the substrate from information on the diffracted light detected by the detection section.

6. The exposure condition determining method according to claim. 1, wherein determining the exposure condition includes determining, as a limit value for the exposure condition, a condition value of the exposure at which. the variation in brightness becomes maximum or approaches the maximum.

7. The exposure condition determining method according to claim 6, wherein determining the exposure condition includes determining a medium value, in a range of the exposure condition determined based on the limit value, as a representative value for the exposure condition.

8. A surface inspection apparatus comprising:

an illumination section which irradiates an illumination light onto a substrate having a plurality of semiconductor pattern features formed on a surface thereof by a predetermined exposure;

a detection section which is optically connected to the illumination section and which detects a diffracted light from the plurality of semiconductor pattern features of the substrate irradiated with the illumination light; and a computation section which performs a computation to determine a condition for an exposure of a substrate based on a variation over a portion of the substrate in brightness of the detected diffracted light from the plurality of semiconductor pattern features, wherein determining the exposure condition comprises determining a variation value of brightness of the diffracted light over a portion of the substrate that corresponds to one or more defects in the semiconductor pattern features, and determining a focus margin, wherein the focus margin is a range of focus offsets corresponding to variation values of brightness that are smaller than the variation value of brightness corresponding to the one or more defects.

* * * * *

UNITED STATES PATENT AND TRADEMARK OFFICE
CERTIFICATE OF CORRECTION

PATENT NO. : 8,665,430 B2  
APPLICATION NO. : 13/340742  
DATED : March 4, 2014  
INVENTOR(S) : Hiroaki Okamoto Page 1 of 1

It is certified that error appears in the above-identified patent and that said Letters Patent is hereby corrected as shown below:

Title Page item (57), in the Abstract, line 5, "including," should read --including:--;

In the Claims:

Claim 1, col. 8, line 60, ".has" should read --has.--.

Signed and Sealed this  
Seventeenth Day of June, 2014

Michelle K. Lee  
*Deputy Director of the United States Patent and Trademark Office*